United States Patent
Penta et al.

(10) Patent No.: US 8,801,959 B1
(45) Date of Patent: *Aug. 12, 2014

(54) STABLE, CONCENTRATABLE SILICON WAFER POLISHING COMPOSITION AND RELATED METHODS

(71) Applicant: Rohm and Haas Electronic Materials CMP Holdings, Inc., Newark, DE (US)

(72) Inventors: Naresh Kumar Penta, Newark, DE (US); Lee Melbourne Cook, Steelville, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/860,830

(22) Filed: Apr. 11, 2013

(51) Int. Cl.
  *C09K 13/00* (2006.01)
  *C09G 1/02* (2006.01)
  *H01L 21/306* (2006.01)

(52) U.S. Cl.
  CPC ............ *C09G 1/02* (2013.01); *H01L 21/30625* (2013.01)
  USPC .......................................... 252/79.1; 216/88

(58) Field of Classification Search
  USPC ........................................... 252/79.1; 216/88
  See application file for complete search history.

(56) References Cited

U.S. PATENT DOCUMENTS

| 5,860,848 A | 1/1999 | Loncki et al. |
| 8,147,295 B2 | 4/2012 | Katoh et al. |
| 2012/0295443 A1 | 11/2012 | Morinaga et al. |

FOREIGN PATENT DOCUMENTS

WO  2012105651  8/2012

OTHER PUBLICATIONS

Copending U.S. Appl. No. 13/860,806.

*Primary Examiner* — Roberts Culbert
(74) *Attorney, Agent, or Firm* — Thomas S. Deibert

(57) ABSTRACT

A stable, concentratable silicon wafer polishing composition for polishing silicon wafers is provided, containing: water; an abrasive; a cation according to formula (I); piperazine or a piperazine derivative according to formula (II); and, optionally, a pH adjusting agent; wherein the polishing composition exhibits a silicon removal rate of at least 300 nm/min. Also provided are methods of making and using the stabilized, concentratable chemical mechanical polishing composition.

10 Claims, No Drawings

STABLE, CONCENTRATABLE SILICON WAFER POLISHING COMPOSITION AND RELATED METHODS

The present invention relates generally to the field of chemical mechanical polishing. In particular, the present invention is directed to a stabilized, concentratable chemical mechanical polishing composition and method for chemical mechanical polishing of silicon wafers.

Silicon wafers for use in the semiconductor industry typically require a very high degree of surface perfection before they can be utilized in device manufacture. The silicon wafer surfaces are produced by chemical mechanical polishing of the wafer surfaces with a polishing slurry. Polishing slurries conventionally consist of a composition that includes a concentration of submicron abrasive particles. The silicon wafer is bathed or rinsed in the polishing slurry in combination with a polishing pad which is pressed against the surface of the silicon wafer and rotated such that the abrasive particles in the polishing slurry are pressed against the surface of the silicon wafer under a load. The lateral motion of the polishing pad causes the abrasive particles in the polishing slurry to move across the silicon wafer surface, resulting in wear, or volumetric removal of the material from the surface of the silicon wafer. Ideally, this process results in the selective removal of projecting surface features so that when the process is finished a perfectly planar surface is produced down to the finest level of detail.

The silicon polishing process that are conventionally practiced in the industry consist of two or more steps. In the first polish step, (i.e., coarse polish step) gross defects remaining from wafer sawing and shaping operations are removed. The wafer surface appears smooth and specular following the first polish step, but still contains numerous minute defects. These minute defects are removed by a subsequent final polish step that removes a small amount of material from the surface, but act to polish away the surface defects. The present invention relates to solutions which are particularly useful for the first polish step through the final polish step.

The number and permissible size of any surface imperfections on the silicon wafer surface remaining after polishing is continually decreasing. Some of the most critical material specifications for silicon wafers are: the surface metals content, the front surface micro roughness and the total particle per unit area.

One polishing composition for final polishing silicon wafers is disclosed in U.S. Pat. No. 5,860,848 to Loncki et al. Loncki et al. disclose a polishing composition comprising: water, submicron silica particles at 0.02 to 0.5 percent by weight in said composition, a salt at a concentration of 100 to 1,000 ppm, an amine compound at a concentration sufficient to effect a composition pH of 8 to 11, and a polyelectrolyte dispersion agent at a concentration of 20 to 500 ppm, wherein said composition has a total sodium and potassium content below about 1 ppm, and an iron, nickel, and copper content each below about 0.1 ppm, all ppm being parts per million by weight of said composition.

There nevertheless remains a need for new stabilized, concentratable chemical mechanical polishing compositions for final polishing silicon wafers. Particularly, there is a need for new stabilized, concentratable chemical mechanical polishing compositions for stock silicon wafer polishing (i.e., first step) through the final polishing of the silicon wafers which exhibit a silicon removal rate of ≥300 nm/min.

The present invention provides a stabilized, concentratable chemical mechanical polishing composition for polishing a silicon wafer, comprising: water; an abrasive; a cation according to formula (I):

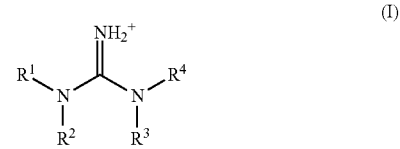

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and, piperazine or a piperazine derivative according to formula (II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and, optionally, a pH adjusting agent; wherein the polishing composition exhibits a silicon removal rate of at least 300 nm/min.

The present invention provides a stabilized, concentratable chemical mechanical polishing composition for polishing a silicon wafer, comprising: water; an abrasive; a cation according to formula (I):

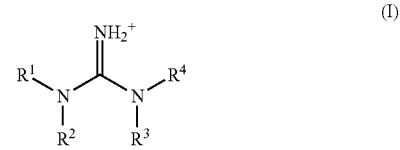

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and, piperazine or a piperazine derivative according to formula (II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and, optionally, a pH adjusting agent; wherein the polishing composition exhibits a silicon removal rate of at least 300 nm/min; and, wherein the polishing composition contains <1 ppm of polymers.

The present invention provides a stabilized, concentratable chemical mechanical polishing composition for polishing a silicon wafer, comprising: water; a colloidal silica abrasive; a cation according to formula (I):

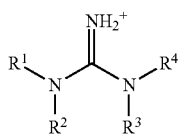

wherein $R^1$, $R^2$, $R^3$, $R^4$ are each a hydrogen; and, piperazine or a piperazine derivative according to formula (II)

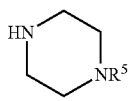

wherein $R^5$ is a hydrogen; and, optionally, a pH adjusting agent; wherein the polishing composition exhibits a silicon removal rate of at least 300 nm/min.

The present invention provides a stabilized, concentratable chemical mechanical polishing composition for polishing a silicon wafer, comprising: water; a colloidal silica abrasive; a cation according to formula (I):

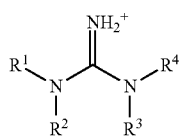

wherein $R^1$, $R^2$, $R^3$, $R^4$ are each a hydrogen; and, piperazine or a piperazine derivative according to formula (II)

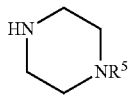

wherein $R^5$ is a hydrogen; and, optionally, a pH adjusting agent; wherein the polishing composition exhibits a silicon removal rate of at least 300 nm/min; and, wherein the polishing composition contains <1 ppm of polymers.

The present invention provides a method of making the stabilized, concentratable chemical mechanical polishing composition of the present invention, comprising: providing a water; providing an abrasive; providing a source of cations according to formula (I)

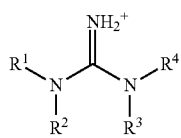

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and, providing a source of piperazine or a piperazine derivative according to formula (II)

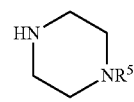

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; optionally, providing a pH adjusting agent; and, combining the water, the source of cations according to formula (I), the source of piperazine or piperazine derivative according to formula (II) and the optional pH adjusting agent; wherein the stabilized, concentratable chemical mechanical polishing composition exhibits a pH of 8 to 12.

The present invention provides a method of polishing a silicon wafer, comprising: providing a silicon wafer; providing a stabilized, concentratable chemical mechanical polishing composition according to the present invention; providing a chemical mechanical polishing pad; providing a polishing machine; installing the silicon wafer and the chemical mechanical polishing pad in the polishing machine; creating dynamic contact at an interface between the chemical mechanical polishing pad and the silicon wafer with a down force of ≥0.5 kPa; and dispensing the stabilized, concentratable chemical mechanical polishing composition onto the chemical mechanical polishing pad at or near the interface between the chemical mechanical polishing pad and the silicon wafer; wherein the stabilized, concentratable chemical mechanical polishing composition has a pH of 8 to 11.

The present invention provides a method of polishing a silicon wafer, comprising: providing a silicon wafer; providing a stabilized, concentratable chemical mechanical polishing composition according to the present invention; providing a chemical mechanical polishing pad; providing a polishing machine; installing the silicon wafer and the chemical mechanical polishing pad in the polishing machine; creating dynamic contact at an interface between the chemical mechanical polishing pad and the silicon wafer with a down force; and, dispensing the stabilized, concentratable chemical mechanical polishing composition onto the chemical mechanical polishing pad at or near the interface between the chemical mechanical polishing pad and the silicon wafer; wherein the stabilized, concentratable chemical mechanical polishing composition has a pH of 8 to 11; wherein the stabilized, concentratable chemical mechanical polishing composition exhibits a silicon removal rate of at least 300 nm/min with a platen speed of 63 revolutions per minute, a carrier speed of 57 revolutions per minute, a stabilized, concentratable chemical mechanical polishing composition flow rate of 200 ml/min, and a down force of 27.58 kPa (4 psi) on a 200 mm polishing machine where the chemical mechanical polishing pad comprises a polyurethane impregnated, non-woven polyester felt pad.

DETAILED DESCRIPTION

The stabilized, concentratable chemical mechanical polishing composition of the present invention is useful for polishing silicon wafers, particularly silicon wafers having a native oxide on the surface thereof. The stabilized, concentratable chemical mechanical polishing composition of the present invention preferably contains an abrasive and a silicon removal rate enhancing, synergistic, combination of (1) a cation according to formula (I); and, (ii) piperazine or a piperazine derivative according to formula (II).

Preferably, stabilized, concentratable chemical mechanical polishing composition of the present invention is stable (as determined by the method used in Examples S2 hereinbelow) when concentrated to up to eight times its designed for point of use concentration (i.e., the concentration of the chemical mechanical polishing composition used for actual silicon wafer polishing).

Preferably, the abrasive used in the stabilized, concentratable chemical mechanical polishing composition of the present invention is selected from the group consisting of inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive is a colloidal silica abrasive. Preferably, the colloidal silica abrasive contains at least one of fumed silica, precipitated silica and agglomerated silica.

The abrasive used in the stabilized, concentratable chemical mechanical polishing composition of the present invention preferably has an average particle size of ≤100 nm (more preferably, 1 to 100 nm). More preferably, the abrasive used in the stabilized, concentratable chemical mechanical polishing composition of the present invention is a colloidal silica abrasive having an average particle size of ≤100 nm (preferably, 1 to 100 nm; more preferably, 10 to 40 nm; still more preferably, 10 to 30 nm; most preferably, 20 to 30 nm).

The stabilized, concentratable chemical mechanical polishing composition of the present invention preferably contains 0.001 to 0.5 wt % (more preferably, 0.075 to 0.1 wt %; still more preferably, 0.01 to 0.075 wt %; most preferably, 0.04 to 0.06 wt %) of an abrasive. More preferably, the stabilized, concentratable chemical mechanical polishing composition of the present invention preferably contains 0.001 to 0.5 wt % (more preferably, 0.075 to 0.1 wt %; still more preferably, 0.01 to 0.075 wt %; most preferably, 0.04 to 0.06 wt %) of a colloidal silica abrasive. Most preferably, the stabilized, concentratable chemical mechanical polishing composition of the present invention preferably contains 0.001 to 0.5 wt % (more preferably, 0.075 to 0.1 wt %; still more preferably, 0.01 to 0.075 wt %; most preferably, 0.04 to 0.06 wt %) of a colloidal silica abrasive, wherein the colloidal silica abrasive exhibits an average particle size of 1 to 50 nm (more preferably, 20 to 30 nm).

The water contained in the stabilized, concentratable chemical mechanical polishing composition of the present invention, is preferably at least one of deionized and distilled to limit incidental impurities.

Preferably, the stabilized, concentratable chemical mechanical polishing composition of the present invention contains 0.0005 to 10 moles/L (more preferably, 0.005 to 1 moles/L; still more preferably, 0.01 to 0.5 moles/L; most preferably, 0.04 to 0.06 moles/L) of a cation according to formula (I)

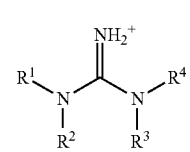

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group). Most preferably, the stabilized, concentratable chemical mechanical polishing composition of the present invention contains 0.0005 to 10 wt % (more preferably, 0.005 to 1 wt %; still more preferably, 0.01 to 0.5 wt %; most preferably, 0.04 to 0.06 wt %) of a cation according to formula (I), wherein the cation according to formula (I) is according to formula (Ia)

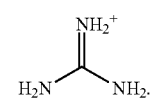

(Ia)

Preferably, the stabilized, concentratable chemical mechanical polishing composition of the present invention contains 0.0005 to 10 moles/L (more preferably, 0.005 to 1 moles/L; still more preferably, 0.01 to 0.5 moles/L; most preferably, 0.04 to 0.06 moles/L) of piperazine or a piperazine derivative according to formula (II)

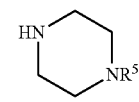

(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group). Most preferably, the stabilized, concentratable chemical mechanical polishing composition of the present invention contains 0.0005 to 10 moles/L (more preferably, 0.005 to 1 moles/L; still more preferably, 0.01 to 0.5 moles/L; most preferably, 0.04 to 0.06 moles/L) of piperazine.

The stabilized, concentratable chemical mechanical polishing composition of the present invention provides efficacy over a pH of 8 to 12. Preferably, the stabilized, concentratable chemical mechanical polishing composition of the present invention exhibits a pH of 8 to 12 (more preferably, 9 to 11; still more preferably, 9.5 to 11.5; most preferably 10). To achieve the desired pH, the stabilized, concentratable chemical mechanical polishing composition of the present invention may optionally contain a pH adjusting agent. Preferably, the pH adjusting agent is an inorganic pH adjusting agent. Preferred inorganic pH adjusting agents including inorganic acids and bases. Preferred inorganic acid pH adjusting agents are selected from phosphoric acid, nitric acid, sulfuric acid and hydrochloric acid (most preferably, nitric acid). Preferred inorganic base pH adjusting agents are selected from ammonium hydroxide and potassium hydroxide (most preferably, potassium hydroxide).

The stabilized, concentratable chemical mechanical polishing composition of the present invention preferably further comprises ions selected from the group consisting of carbonate ions and phosphate ions. More preferably, the stabilized, concentratable chemical mechanical polishing composition of the present invention contains 0.00025 to 5 moles/L (more preferably, 0.0025 to 0.5 moles/L; still more preferably, 0.005 to 0.25 moles/L; most preferably, 0.02 to 0.03 moles/L) of ions selected from the group consisting of carbonate ions and phosphate ions. Still more preferably, the stabilized, concentratable chemical mechanical polishing composition of the present invention contains 0.00025 to 5 moles/L (more preferably, 0.0025 to 0.5 moles/L; still more preferably, 0.005 to 0.25 moles/L; most preferably, 0.02 to 0.03 moles/L) of phosphate ions. Most preferably, the stabilized, concentratable chemical mechanical polishing composition of the present invention contains 0.00025 to 5 moles/L (more preferably, 0.0025 to 0.5 moles/L; still more preferably, 0.005 to 0.25 moles/L; most preferably, 0.02 to 0.03 moles/L) of carbonate.

The stabilized, concentratable chemical mechanical polishing composition of the present invention preferably further comprises halide ions (preferably, chloride ions). More preferably, the chemical mechanical polishing 0.0001 to 4 wt % (more preferably, 0.001 to 0.5 wt %; still more preferably, 0.003 to 0.2 wt %; most preferably, 0.01 to 0.03 wt %) of halide ions (preferably, chloride ions).

The stabilized, concentratable chemical mechanical polishing composition of the present invention preferably contains <1 ppm (more preferably, <0.1 ppm; still more preferably, <0.01 ppm) of polymers. Most preferably, the stabilized, concentratable chemical mechanical polishing composition of the present invention is free of polymers (e.g., water soluble polymers, such as cellulose based polymers; and polyelectrolytes, such as hydroxyethyl cellulose, polyvinyl alcohol, polyacrylamide, polyvinyl pyrrolidone, polyethylene glycol, polypropylene glycol, polyethylene oxide, polyacrylic acid).

The method of making the stabilized, concentratable chemical mechanical polishing composition of the present invention, preferably comprises: providing a water (preferably, a water that is at least one of deionized and distilled; more preferably, a water that is both deionized and distilled); providing an abrasive (preferably, a colloidal silica abrasive; more preferably, a colloidal silica abrasive having an average particle size of 10 to 50 nm; most preferably, a colloidal silica abrasive having an average particle size of 20 to 30 nm); providing a source of cations according to formula (I)

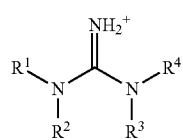

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group; most preferably, a hydrogen (i.e., wherein the anion is

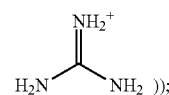

and, providing a source of piperazine or a piperazine derivative according to formula (II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group; most preferably, a hydrogen); optionally, providing a pH adjusting agent; and, combining the water, the source of cations according to formula (I), the source of piperazine or piperazine derivative according to formula (II) and the optional pH adjusting agent; wherein the stabilized, concentratable chemical mechanical polishing composition exhibits a pH of 8 to 12 (preferably 9 to 11; more preferably 9.5 to 10.5; most preferably 10). Preferably, in the method of making the stabilized, concentratable chemical mechanical polishing composition of the present invention, the source of cations according to formula (I) is selected from the group consisting of guanidine carbonate (i.e., $(H_2NC(=NH)NH_2)_2 \cdot H_2CO_3$) and guanidine phosphate (i.e., $(H_2NC(=NH)NH_2)_2 \cdot H_3PO_4$). Preferably, in the method of making the stabilized, concentratable chemical mechanical polishing composition of the present invention, the source of piperazine or piperazine derivative according to formula (II) is piperazine dihydrochloride hydrate.

The method of polishing a silicon wafer of the present invention preferably comprises: providing a silicon wafer; providing a stabilized, concentratable chemical mechanical polishing composition according to the present invention; providing a chemical mechanical polishing pad; providing a polishing machine; installing the silicon wafer and the chemical mechanical polishing pad in the polishing machine; creating dynamic contact at an interface between the chemical mechanical polishing pad and the silicon wafer with a down force of ≥0.5 kPa (preferably 0.5 to 100 kPa; more preferably, 0.7 to 50 kPa; still more preferably, 6 to 35 kPa; most preferably, 20 to 30 kPa); and dispensing the stabilized, concentratable chemical mechanical polishing composition onto the chemical mechanical polishing pad at or near the interface between the chemical mechanical polishing pad and the silicon wafer; wherein the stabilized, concentratable chemical mechanical polishing composition has a pH of 8 to 12 (preferably, 9 to 11; more preferably 9.5 to 10.5; most preferably 10). Preferably, the stabilized, concentratable chemical mechanical polishing composition used in the method of the present invention exhibits a silicon removal rate of at least 300 nm/min (more preferably, at least 400 nm/min; most preferably, at least 500 nm/min) with a platen speed of 63 revolutions per minute, a carrier speed of 57 revolutions per minute, a stabilized, concentratable chemical mechanical polishing composition flow rate of 200 ml/min, and a nominal down force of 27.58 kPa (4 psi) on a 200 mm polishing machine, wherein the chemical mechanical polishing pad used comprises a polyurethane impregnated, non-woven polyester felt pad.

Some embodiments of the present invention will now be described in detail in the following Examples.

Comparative Examples C1-C16 and Examples 1-3

Chemical Mechanical Polishing Composition Preparation

Chemical mechanical polishing compositions were prepared by combining the components in the amounts listed in TABLE 1 and adjusting the pH of the compositions to the final pH listed in TABLE 1 with $HNO_3$ or KOH as required.

TABLE 1

| Ex # | Abrasive[ζ] (ppm) | A. Guanidine carbonate[¥] (Moles/L) | B. Piperazine hydrochloride hydrate[λ] (Moles/L) | Conc. A + B (Moles/L) | pH |
|---|---|---|---|---|---|
| C1 | 0 | 0.01 | 0 | 0.01 | 10 |
| C2 | 0 | 0 | 0.01 | 0.05 | 10 |
| C3 | 0 | 0.05 | 0 | 0.1 | 10 |
| C4 | 0 | 0 | 0.05 | 0.01 | 10 |
| C5 | 0 | 0.1 | 0 | 0.01 | 10 |
| C6 | 0 | 0 | 0.1 | 0.05 | 10 |
| C7 | 0 | 0.005 | 0.005 | 0.1 | 10 |
| C8 | 0 | 0.025 | 0.025 | 0.05 | 10 |
| C9 | 0 | 0.05 | 0.05 | 0.1 | 10 |
| C10 | 500 | 0 | 0.006 | 0.006 | 10 |
| C11 | 500 | 0 | 0.031 | 0.031 | 10 |
| C12 | 500 | 0 | 0.063 | 0.063 | 10 |
| C13 | 500 | 0.011 | 0 | 0.011 | 10 |
| C14 | 500 | 0.056 | 0 | 0.056 | 10 |
| C15 | 500 | 0.111 | 0 | 0.111 | 10 |
| C16 | 500 | 0.1 | 0 | 0.1 | 10 |
| 1 | 500 | 0.006 | 0.003 | 0.009 | 10 |
| 2 | 500 | 0.028 | 0.016 | 0.044 | 10 |
| 3 | 500 | 0.056 | 0.031 | 0.087 | 10 |

[ζ]Klebosol ™ 1598-B25 slurry manufactured by AZ Electronic Materials, available from The Dow Chemical Company.
[¥]guanidine carbonate (available from Sigma-Aldrich)
[λ]piperazine hydrochloride hydrate (available from Sigma-Aldrich)

Comparative PC1-PC9

Chemical Mechanical Polishing Experiments

Silicon removal rate polishing tests were performed using the chemical mechanical polishing compositions prepared according to Comparative Examples C1-C9. Specifically, the silicon removal rate for each of the chemical mechanical polishing compositions C1-C9 identified in TABLE 1. These silicon removal rate experiments were performed using eight inch Si(100) wafers, which were pre-etched in a 0.5 wt % hydrofluoric acid solution for 90 seconds, using a Strasbaugh Model 6EC polisher and a Suba1200™ a polyurethane impregnated, non-woven polyester felt pad (commercially available from Rohm and Haas Electronic Materials CMP Inc.) with a down force of 27.58 kPa (4 psi), a chemical mechanical polishing composition flow rate of 200 ml/min, a table rotation speed of 63 rpm and a carrier rotation speed of 57 rpm. The silicon removal rates were determined from a measurement of the weight loss from the individual Si(100) wafers from the polishing. The results of the silicon removal rate experiments are provided in TABLE 2.

TABLE 2

| Polish Example # | Polishing Composition | Si(100) removal rate (nm/min) |
|---|---|---|
| PC1 | C1 | 357 |
| PC2 | C2 | 377 |
| PC3 | C3 | 459 |
| PC4 | C4 | 425 |
| PC5 | C5 | 489 |
| PC6 | C6 | 461 |
| PC7 | C7 | 404 |
| PC8 | C8 | 481 |
| PC9 | C9 | 504 |

Comparative PC10-PC15 and Examples P1-P3

Chemical Mechanical Polishing Experiments

Silicon removal rate polishing tests were performed using the chemical mechanical polishing compositions prepared according to Comparative Examples C10-C15 and Examples 1-3. Specifically, the silicon removal rate for each of the chemical mechanical polishing compositions C10-C15 and 1-3 identified in TABLE 1. These silicon removal rate experiments were performed using eight inch Si(100) wafers (having a native oxide on the surface) using a Strasbaugh Model 6EC polisher and a Suba1200™ a polyurethane impregnated, non-woven polyester felt pad (commercially available from Rohm and Haas Electronic Materials CMP Inc.) with a down force of 27.58 kPa (4 psi), a chemical mechanical polishing composition flow rate of 200 ml/min, a table rotation speed of 63 rpm and a carrier rotation speed of 57 rpm. The silicon removal rates were determined from a measurement of the weight loss from the individual Si(100) wafers from the polishing. The results of the silicon removal rate experiments are provided in TABLE 3.

TABLE 3

| Polish Example # | Polishing Composition | Si(100) removal rate (nm/min) |
|---|---|---|
| PC10 | C10 | 351 |
| PC11 | C11 | 448 |
| PC12 | C12 | 489 |
| PC13 | C13 | 364 |
| PC14 | C14 | 473 |
| PC15 | C15 | 518 |
| P1 | 1 | 391 |
| P2 | 2 | 503 |
| P3 | 3 | 546 |

Comparative Example SC16 and Examples S2

Stability Experiments

Concentrated, chemical mechanical polishing compositions having concentration factors of 1×, 2×, 4×, 8×, 12× and 20×, relative to base chemical mechanical polishing compositions of Comparative Example C16 and Example 2, were prepared. Each of these concentrated, chemical mechanical polishing compositions were then stored in a separate, sealed, glass container for a period of two weeks under air, at 21° C. and atmospheric pressure. At the end of the two week period, the contents of the containers were observed. In the stable, concentrated, chemical mechanical polishing compositions, no abrasive particles were observed to have precipitated onto the bottom of the glass container. The results of these observations are reported in TABLE 4.

TABLE 4

| Concentration Factor | Ex. C16 base formulation | Ex. 2 base formulation |
|---|---|---|
| 1× | stable | stable |
| 2× | Precipitated abrasive | stable |
| 4× | Precipitated abrasive | stable |
| 8× | Precipitated abrasive | stable |
| 12× | Precipitated abrasive | Precipitated abrasive |
| 20× | Precipitated abrasive | Precipitated abrasive |

We claim:

1. A stabilized, concentratable chemical mechanical polishing composition for polishing a silicon wafer, comprising:
water;
an abrasive;
a cation according to formula (I):

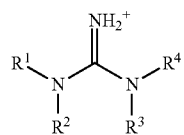

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and,
piperazine or a piperazine derivative according to formula (II)

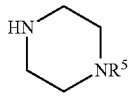

(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and,
optionally, a pH adjusting agent;
wherein the polishing composition exhibits a silicon removal rate of at least 300 nm/min.

2. The stabilized, concentratable chemical mechanical polishing composition of claim 1, wherein the silicon wafer has a native oxide on the surface thereof; wherein the stabilized, concentratable chemical mechanical polishing composition contains 0.001 to 0.5 wt % abrasive; and, wherein the abrasive is a colloidal silica abrasive having an average particle size of 20 to 30 nm.

3. The stabilized, concentratable chemical mechanical polishing composition of claim 2, wherein the stabilized, concentratable chemical mechanical polishing composition contains <1 ppm of polymers.

4. The stabilized, concentratable chemical mechanical polishing composition of claim 3, further comprising:
carbonate ions or phosphate ions.

5. The stabilized, concentratable chemical mechanical polishing composition of claim 4, further comprising:
halide ions.

6. The stabilized, concentratable chemical mechanical polishing composition of claim 1, wherein abrasive remains dispersed and does not settle out following storage of the stabilized, concentratable chemical mechanical polishing composition for a period of at least two weeks at 21° C. and atmospheric pressure.

7. A method of making the stabilized, concentratable chemical mechanical polishing composition of claim 1, comprising:
providing a water;
providing an abrasive;
providing a source of cations according to formula (I)

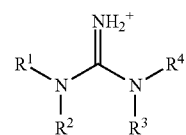

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and,
providing a source of piperazine or a piperazine derivative according to formula (II)

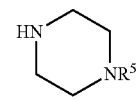

(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group;
optionally, providing a pH adjusting agent; and,
combining the water, the source of cations according to formula (I), the source of piperazine or piperazine derivative according to formula (II) and the optional pH adjusting agent;
wherein the stabilized, concentratable chemical mechanical polishing composition exhibits a pH of 8 to 12.

8. The method of claim 7, wherein the source of cations according to formula (I) is selected from the group consisting of guanidine carbonate and guanidine phosphate; and, wherein the source of piperazine or piperazine derivative according to formula (II) is piperazine dihydrochloride hydrate.

9. A method of polishing a silicon wafer, comprising:
providing a silicon wafer;
providing a stabilized, concentratable chemical mechanical polishing composition according to claim 1;
providing a chemical mechanical polishing pad;
providing a polishing machine;
installing the silicon wafer and the chemical mechanical polishing pad in the polishing machine;
creating dynamic contact at an interface between the chemical mechanical polishing pad and the silicon wafer with a down force of ≥0.5 kPa; and
dispensing the stabilized, concentratable chemical mechanical polishing composition onto the chemical mechanical polishing pad at or near the interface between the chemical mechanical polishing pad and the silicon wafer;

wherein the stabilized, concentratable chemical mechanical polishing composition has a pH of 8 to 11.

10. The method of claim 9, wherein the stabilized, concentratable chemical mechanical polishing composition exhibits a silicon removal rate of at least 300 nm/min with a platen speed of 63 revolutions per minute, a carrier speed of 57 revolutions per minute, a stabilized, concentratable chemical mechanical polishing composition flow rate of 200 ml/min, and a down force of 27.58 kPa (4 psi) on a 200 mm polishing machine where the chemical mechanical polishing pad comprises a polyurethane impregnated, non-woven polyester felt pad.

\* \* \* \* \*